US006720787B2

(12) United States Patent
Kimura et al.

(10) Patent No.: US 6,720,787 B2
(45) Date of Patent: Apr. 13, 2004

(54) ANISOTROPICALLY CONDUCTIVE SHEET, PRODUCTION PROCESS THEREOF AND APPLIED PRODUCT THEREOF

(75) Inventors: Kiyoshi Kimura, Tokyo (JP); Sugiro Shimoda, Tokyo (JP); Naoshi Yasuda, Tokyo (JP); Daisuke Yamada, Hidaka (JP)

(73) Assignee: JSR Corporation, Tokyo (JP)

( * ) Notice: Subject to any disclaimer, the term of this patent is extended or adjusted under 35 U.S.C. 154(b) by 239 days.

(21) Appl. No.: 09/961,143

(22) Filed: Sep. 24, 2001

(65) Prior Publication Data

US 2002/0060583 A1 May 23, 2002

(30) Foreign Application Priority Data

Sep. 25, 2000 (JP) ....................................... 2000-289804

(51) Int. Cl.$^{7}$ ................................................ G01R 31/26

(52) U.S. Cl. ....................... 324/765; 324/754; 324/761; 29/884; 439/66

(58) Field of Search ................................ 324/754–755, 324/758, 761, 765, 158.1; 29/82.5, 829–830, 846, 874, 877, 883–884; 439/66–67, 91, 591; 264/108, 331.13, 331.14, 338

(56) References Cited

U.S. PATENT DOCUMENTS

| | | | | | |
|---|---|---|---|---|---|
| 4,209,481 | A | * | 6/1980 | Kashiro et al. | 264/437 |
| 5,672,978 | A | * | 9/1997 | Kimura | 324/754 |
| 5,975,915 | A | * | 11/1999 | Yamazaki et al. | 439/72 |
| 6,297,652 | B1 | * | 10/2001 | Shimoda et al. | 324/754 |
| 6,453,553 | B1 | * | 9/2002 | Caillat et al. | 29/884 |

FOREIGN PATENT DOCUMENTS

| | | |
|---|---|---|
| JP | 53-896 | 1/1978 |
| JP | 5-155982 | 6/1993 |

* cited by examiner

*Primary Examiner*—Minh N. Tang
(74) *Attorney, Agent, or Firm*—Oblon, Spivak, McClelland, Maier & Neustadt, P.C.

(57) ABSTRACT

An anisotropically conductive sheet can retain required conductivity over a long time even when used repeatedly, or used under a high -temperature environment. The sheet contains conductive particles exhibiting magnetism in a state oriented in a thickness-wise direction in an elastic polymeric substance having a durometer hardness of 20 to 90. The particles are coated with a lubricant or parting agent. In addition, the sheet has a long service life owing to its high durability and thermal durability.

27 Claims, 6 Drawing Sheets

ANISOTROPICALLY CONDUCTIVE SHEET, PRODUCTION PROCESS THEREOF AND APPLIED PRODUCT THEREOF

BACKGROUND OF THE INVENTION

1. Field of the Invention

The present invention relates to an anisotropically conductive sheet suitable for use, for example, in electrical connection between circuit devices such as electronic parts, or as a connector in inspection apparatus for circuit devices such as printed circuit boards and semiconductor integrated circuits, to a production process thereof, and to applied products thereof.

2. Description of the Background Art

An anisotropically conductive sheet is a sheet exhibiting conductivity only in its thickness-wise direction or having pressure-sensitive conductive conductor parts exhibiting conductivity only in its thickness-wise direction when pressurized in the thickness-wise direction. Since the anisotropically conductive sheet has features that compact electrical connection can be achieved without using any means such as soldering or mechanical fitting, and that soft connection is feasible with mechanical shock or strain absorbed therein, it is widely used as a connector for achieving electrical connection of a circuit device, such as a printed circuit board with a leadless chip carrier, liquid crystal panel or the like in fields of, for example, electronic computers, electronic digital clocks, electronic cameras and computer key boards.

On the other hand, in electrical inspection of circuit devices such as printed circuit boards or semiconductor integrated circuits, it is conducted to cause an anisotropically conductive sheet to intervene between an electrode region to be inspected of a circuit device, which is an inspection target, and an electrode region for inspection of a circuit board for inspection in order to achieve electrical connection between electrodes to be inspected formed on one surface of the circuit device to be inspected and electrodes for inspection formed on the surface of the circuit board for inspection.

As such anisotropically conductive sheets, there have heretofore been known those of various structures. For example, Japanese Patent Application Laid-Open No. 93393/1976 discloses anisotropically conductive sheets obtained by uniformly dispersing metal particles in an elastomer, and Japanese Patent Application Laid-Open No. 147772/1978 discloses anisotropically conductive sheets obtained by unevenly distributing particles of a conductive magnetic material in an elastomer to form many conductive path-forming parts extending in the thickness-wise direction thereof and insulating parts for mutually insulating them. Further, Japanese Patent Application Laid-Open No. 250906/1986 discloses anisotropically conductive sheets with a difference in level defined between the surface of conductive path-forming parts and insulating parts.

As illustrated in FIG. 17, in these anisotropically conductive sheets, conductive particles P are contained in a base material composed of an elastic polymeric substance E in a state oriented so as to align in the thickness-wise direction of each sheet to form a chain C, and adhered integrally to the elastic polymeric substance E.

However, the conventional anisotropically conductive sheets involve the following problems.

In electrical inspection of a circuit device, as illustrated in FIG. 18, an electrode 91 to be inspected of the circuit device (hereinafter may also be referred to as "the circuit device to be inspected") 90, which is an inspection target, is brought into contact with a surface of the anisotropically conductive sheet, for example, an end surface of a conductive path-forming part while an electrode 96 for inspection of a circuit board 95 for inspection is brought into contact with another surface of the anisotropically conductive sheet, for example another and surface of the conduct path-forming part, and the anisotropically conductive sheet is pressurized in the thickness-wise direction thereof, thereby achieving electrical connection between the electrode 91 to be inspected of the circuit device 90 to be inspected and the electrode 96 for inspection of the circuit board 95 for inspection.

In this state, the anisotropically conductive sheet is held between and pressurized by the electrode to be inspected of the circuit device to be inspected and the electrode for inspection of the circuit board for inspection, whereby the elastic polymeric substance E making up the base material is compressed in the thickness-wise direction to be deformed, and moreover the conductive particles P are moved, and so the chain C thereof is changed from the linear form extending in the thickness-wise direction to a complicated form, and a portion about the conductive particles P in the elastic polymeric substance E is deformed into a complicated form with the movement of the conductive particles P, since the elastic polymeric substance E and the conductive particles P adhere integrally to each other.

As described above, in the conventional anisotropically conductive sheets, not only compressive force in the thickness-wise direction, but also complicated and considerably great stress caused by the movement of the conductive particles is applied to the portion about the conductive particles P in the elastic polymeric substance E making up the base material at every time the sheet is held pressurized in the thickness-wise direction thereof. Therefore, the portion about the conductive particles P in the elastic polymeric substance E is deteriorated when the sheet is used repeatedly. As a result, an electrical resistance of the sheet in the thickness-wise direction is increased, and so the required conductivity cannot be retained to fail to achieve long service life.

In the electrical inspection of circuit devices such as semiconductor integrated circuits and printed circuit boards, tests under a high-temperature environment, such as a burn-in test and a heat cycle test are conducted for the purpose of developing latent defects of such a circuit device. Since the coefficient of thermal expansion of the elastic polymeric substance E making up the base material of the anisotropically conductive sheet is great, the elastic polymeric substance intends to expand when it is exposed to a high-temperature environment. Therefore, when the temperature about the anisotropically conductive sheet is raised in the state that the anisotropically conductive sheet has been held pressurized in the thickness-wise direction thereof, i.e., the state that the portion about the conductive particles P in the elastic polymeric substance E making up the base material has been deformed into a complicated form, greater stress is applied to the portion about the conductive particles P in the elastic polymeric substance E, and so the portion about the conductive particles P in the elastic polymeric substance E is prematurely deteriorated when such a test under the high-temperature environment is conducted repeatedly. As a result, the required conductivity cannot be retained to more shorten the service life.

SUMMARY OF THE INVENTION

The present invention has been made on the basis of the foregoing circumstances and the first object thereof is to provide of an anisotropically conductive sheet capable of retaining the required conductivity over a long period of time even when it is used repeatedly over many times, or even when it is used under a high-temperature environment, and thus achieving a long service life owing to its high durability upon repeated use and thermal durability.

The second object of the present invention is to provide a process for producing an anisotropically conductive sheet capable of achieving a long service life owing to its high durability upon repeated use and thermal durability.

The third object of the present invention is to provide an adapter for inspection of circuit devices, which is equipped with an anisotropically conductive sheet capable of achieving a long service life owing to its high durability upon repeated use and thermal durability and permits executing inspection of a circuit device with high efficiency and stably retaining a good electrically connected state even at varied temperatures.

The fourth object of the present invention is to provide an inspection apparatus for circuit devices, which is equipped with an anisotropically conductive sheet capable of achieving a long service life owing to its high durability upon repeated use and thermal durability and permits executing inspection of a circuit device with high efficiency.

The fifth object of the present invention is to provide an electronic part-packaged structure which permits stably retaining a good electrically connected state over a long period of time.

According to the present invention, there is provided an anisotropically conductive sheet containing conductive particles exhibiting magnetism in a state oriented in a thickness-wise direction of the sheet in an elastic polymeric substance, wherein the durometer hardness of the elastic polymeric substance is 20 to 90, and a lubricant or parting agent is coated on the surfaces of the conductive particles.

In the anisotropically conductive sheet according to the present invention, the amount of the lubricant or parting agent coated on the surfaces of the conductive particles may preferably be 10/Dn to 150/Dn parts by mass per 100 parts by mass of the conductive particles, wherein Dn means the number average diameter ($\mu$m) of the conductive particles.

In the anisotropically conductive sheet according to the present invention, the lubricant or parting agent coated on the surfaces of the conductive particles may preferably be that containing silicone oil.

In the anisotropically conductive sheet described above, the silicone oil may preferably contain fluorine atom(s) in its molecule.

In the anisotropically conductive sheet according to the present invention, the lubricant or parting agent applied to the surfaces of the conductive particles may preferably be a fluorine-containing lubricant or parting agent.

The anisotropically conductive sheet according to the present invention may preferably comprise a plurality of conductive path-forming parts each closely containing the conductive particles and extending in the thickness-wise direction of the sheet, and insulating part(s) for insulating these conductive path-forming parts mutually.

According to the present invention, there is also provided a process for producing an anisotropically conductive sheet, which comprises the steps of coating the surfaces of conductive particles exhibiting magnetism with a lubricant or parting agent, forming a sheet-forming material layer with the conductive particles coated with the lubricant or parting agent dispersed in a liquid material for the elastic polymeric substance, which will become an elastic polymeric substance by a curing treatment, applying a magnetic field to the sheet-forming material layer in the thickness-wise direction thereof, and subjecting the sheet-forming material layer to the curing treatment.

According to the present invention, there is further provided an adapter for inspection of circuit devices, comprising a circuit board for inspection on the surface of which a plurality of electrodes for inspection has been formed in accordance with a pattern corresponding to electrodes to be inspected of a circuit device to be inspected, and the above-described anisotropically conductive sheet integrally provided on a surface of the circuit board for inspection.

In the adapter according to the present invention, at least a part of each of the electrodes for inspection in the circuit board for inspection may preferably be formed of a magnetic material.

According to the present invention, there is still further provided an inspection apparatus for circuit devices, comprising a circuit board for inspection on the surface of which a plurality of electrodes for inspection are formed in accordance with a pattern corresponding to electrodes to be inspected of a circuit device to be inspected, and the above-described anisotropically conductive sheet interposed between the circuit board for inspection and the circuit device.

According to the present invention, there is yet still further provided an electronic part-packaged structure comprising a circuit board and an electronic part electrically connected to the circuit board through the above-described anisotropically conductive sheet.

According to the anisotropically conductive sheet of the present invention, the lubricant or parting agent is applied to the surfaces of the conductive particles, whereby the lubricant or parting agent is interposed between the conductive particles and the elastic polymeric substance making up the base material, and so the conductive particles and the elastic polymeric substance are prevented from adhering integrally to each other and become a state that they can be slidably moved. Accordingly, the portion about the conductive particles in the elastic polymeric substance is prevented from being deformed into the complicated form with the movement of the conductive particles when the sheet is held pressurized in the thickness-wise direction thereof, whereby the stress to be applied to the portion about the conductive particles is relaxed, so that the required conductivity of the sheet is retained over a long period of time even when the sheet is used repeatedly, or it is used under a high-temperature environment.

BRIEF DESCRIPTION OF THE DRAWINGS

The above and other objects, features and advantages of the present invention will become apparent from the following description and the appended claims, taken in conjunction with the accompanying drawings, in which:

DETAILED DESCRIPTION OF THE PREFERRED EMBODIMENTS

The embodiments of the present invention will hereinafter be described in details.

Anisotropically Conductive Sheet

Figure 1:
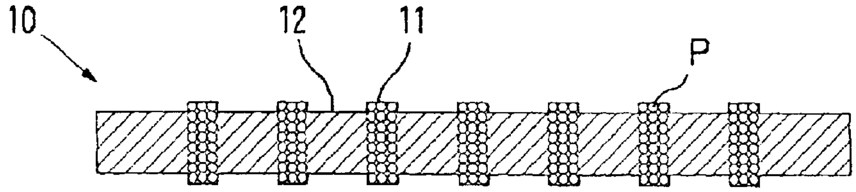
FIG. 1 is a cross-sectional view illustrating the construction of an exemplary anisotropically conductive sheet according to the present invention.

FIG. 1 is a cross-sectional view illustrating the construction of an exemplary anisotropically conductive sheet according to the present invention. In the anisotropically conductive sheet 10, conductive particles P are contained in a base material composed of an elastic polymeric substance in a state oriented so as to be arranged in the thickness-wise direction of the anisotropically conductive sheet 10. Conductive paths are formed by respective chains of the conductive particles P when the sheet is pressurized in the thickness-wise direction. In an embodiment illustrated, the anisotropically conductive sheet is composed of a plurality of columnar conductive path-forming parts 11 each closely filled with the conductive particles P and extending in the thickness-wise direction of the sheet, and an insulating part or parts 12 in which the conductive particles P are not present at all or scarcely present, and which mutually insulate the conductive path-forming parts 11. The conductive path-forming parts 11 are arranged along the plane direction of the sheet according to a pattern corresponding to a pattern of electrodes to be connected, for example, electrodes to be inspected of a circuit device to be inspected, which is an inspection target, and the insulating part 12 is formed so as to surround each of the conductive path-forming parts 11.

In this embodiment, each of the conductive path-forming parts 11 is formed in a state projected from the surface of the insulating part 12.

In the above-described anisotropically conductive sheet 10, the thickness of the insulating part 12 is preferably 0.03 to 2 mm, particularly 0.04 to 1 mm.

The projected height of each of the conductive path-forming parts 11 from the surface of the insulating part 12 is preferably 0.5 to 100%, more preferably 1 to 80%, particularly preferably 5 to 50% of the thickness of the insulating part 12. Specifically, the projected height is preferably 0.01 to 0.3 mm, more preferably 0.02 to 0.2 mm, particularly preferably 0.03 to 0.1 mm.

The diameter of each of the conductive path-forming parts 11 is preferably 0.05 to 1 mm, particularly 0.1 to 0.5 mm.

The elastic polymeric substance making up the base material of the anisotropically conductive sheet 10 has durometer hardness of 20 to 90, preferably 30 to 70.

The term "durometer hardness" as used in the present invention means hardness measured by means of a Type A durometer on the basis of the durometer hardness test prescribed in JIS K 6253.

If the durometer hardness of the elastic polymeric substance is lower than 20, the elastic polymeric substance cannot hold the conductive particles P when the conductive path-forming parts 11 are pressed in the thickness-wise direction and deformed. As a result, permanent set is caused in the conductive path-forming parts 11, so that no good connection reliability is achieved. If the durometer hardness of the elastic polymeric substance exceeds 90 on the other hand, the degree of deformation in the thickness-wise direction in the conductive path-forming parts 11 becomes insufficient when the conductive path-forming parts 11 are pressed in the thickness-wise direction, so that no good connection reliability is achieved, and connection failure is easy to occur.

The elastic polymeric substance making up the base material of the anisotropically conductive sheet 10 is preferably a polymeric substance having a crosslinked structure. As a curable polymeric substance-forming material usable for obtaining the crosslinked polymeric substance, may be used various materials. Specific examples thereof include conjugated diene rubbers such as polybutadiene rubber, natural rubber, polyisoprene rubber, styrene-butadiene copolymer rubber and acrylonitrile-butadiene copolymer rubber and hydrogenated products thereof; block copolymer rubbers such as styrene-butadiene-diene block copolymer rubber and styrene-isoprene block copolymer rubber and hydrogenated products thereof; and besides chloroprene rubber, urethane rubber, polyester rubber, epichlorohydrin rubber, silicone rubber, ethylene-propylene copolymer rubber and ethylene-propylene-diene copolymer rubber.

When weather resistance is required of the resulting anisotropically conductive sheet 10, any other material than the conjugated diene rubbers is preferably used. It is particularly preferred from the viewpoints of molding and processing ability and electrical properties that silicone rubber be used.

As the silicone rubber, is preferred that obtained by crosslinking or condensing liquid silicone rubber. The liquid silicone rubber preferably has a viscosity not higher than $10^5$ poises as measured at a shear rate of $10^{-1}$ sec and may be any of condensation type, addition type and those having a vinyl group or hydroxyl group. As specific examples thereof, may be mentioned dimethyl silicone raw rubber, methylvinyl silicone raw rubber and methylphenylvinyl silicone raw rubber.

Among these, vinyl group-containing liquid silicone rubber (vinyl group-containing dimethyl polysiloxane) is generally obtained by subjecting dimethyldichlorosilane or dimethyldialkoxysilane to hydrolysis and condensation reaction in the presence of dimethylvinylchlorosilane or dimethylvinylalkoxysilane and then fractionating the reaction product by, for example, repeated dissolution-precipitation.

Liquid silicone rubber having vinyl groups at both terminals thereof is obtained by subjecting a cyclic siloxane such as octamethylcyclotetrasiloxane to anionic polymerization in the presence of a catalyst, using, for example, dimethyldivinylsiloxane as a polymerization terminator and suitably selecting other reaction conditions (for example, amounts of the cyclic siloxane and the polymerization terminator). As the catalyst for the anionic polymerization, may be used an alkali such as tetramethylammonium hydroxide or n-butylphosphonium hydroxide or a silanolate solution thereof. The reaction is conducted at a temperature of, for example, 80 to 130° C.

On the other hand, hydroxyl group-containing liquid silicone rubber (hydroxyl group-containing dimethyl polysiloxane) is generally obtained by subjecting dimethyldichlorosilane or dimethyldialkoxysilane to hydrolysis and condensation reaction in the presence of dimethylhydrochlorosilane or dimethylhydro-alkoxysilane and then fractionating the reaction product by, for example, repeated dissolution-precipitation.

Liquid silicone rubber having hydroxyl groups is also obtained by subjecting a cyclic siloxane to anionic polymerization in the presence of a catalyst, using, for example, dimethylhydrochlorosilane, methyldihydrochlorosilane or dimethylhydroalkoxysilane as a polymerization terminator and suitably selecting other reaction conditions (for example, amounts of the cyclic siloxane and the polymerization terminator). As the catalyst for the anionic polymerization, may be used an alkali such as tetramethylammonium hydroxide or n-butylphosphonium hydroxide or a silanolate solution thereof. The reaction is conducted at a temperature of, for example, 80 to 130° C.

Such an elastic polymeric substance preferably has a molecular weight Mw (weight average molecular weight as determined in terms of standard polystyrene) of 10,000 to 40,000. The elastic polymeric substance also preferably has a molecular weight distribution index (a ratio Mw/Mn of weight average molecular weight Mw as determined in terms of standard polystyrene to number average molecular weight Mn as determined in terms of standard polystyrene) of at most 2.0 from the viewpoint of the heat resistance of the resulting anisotropically conductive sheet 10.

In the above, a curing catalyst for curing the polymeric substance-forming material may be contained in the sheet-forming material for obtaining the anisotropically conductive sheet 10. As such a curing catalyst, may be used an organic peroxide, fatty acid azo compound, hydrosilylated catalyst or the like.

Specific example of the organic peroxide used as the curing catalyst include benzoyl peroxide, bisdicyclobenzoyl peroxide, dicumyl peroxide and di-tert-butyl peroxide.

Specific example of the fatty acid azo compound used as the curing catalyst include azobisisobutyronitrile.

Specific example of that used as the catalyst for hydrosilylation reaction include publicly known catalysts such as chloroplatinic acid and salts thereof, platinum-unsaturated group-containing siloxane complexes, vinylsiloxane-platinum complexes, platinum-1,3-divinyltetramethyldisiloxane complexes, complexes of triorganophosphine or triorganophosphite and platinum, acetyl acetate platinum chelates, and cyclic diene-platinum complexes.

The amount of the curing catalyst used is suitably selected in view of the kind of the polymeric substance-forming material, the kind of the curing catalyst and other curing treatment conditions. However, it is generally 3 to 15 parts by mass per 100 parts by mass of the polymeric substance-forming material.

In the sheet-forming material, may be contained an inorganic filler such as general silica powder, colloidal silica, aerogel silica or alumina as needed. By containing such an inorganic filler, the thixotropic property of the sheet-forming material is ensured, the viscosity thereof becomes high, the dispersion stability of the conductive particles P is enhanced, and moreover the strength of the resulting anisotropically conductive sheet 10 can be made high.

No particular limitation is imposed on the amount of such an inorganic filler used. However, the use in a large amount is not preferred because the orientation of the conductive particles P by a magnetic field cannot be fully achieved.

The viscosity of the sheet-forming material is preferably within a range of from 100,000 to 1,000,000 cP.

The conductive particles P contained in the base material are such that the surfaces thereof are coated with a lubricant or parting agent.

As the lubricant or parting agent, various substances may be used so far as they have an effect to lubricate between the elastic polymeric substance making up the base material and the conductive particles P. As specific examples thereof, may be mentioned silicone oil, silicone oil compositions such as silicone greases obtained by compounding a thickening agent such as metal soap into silicone oil and silicone oil compounds obtained by compounding fine silica powder or the like into silicone oil, fluorine-containing lubricants or parting agents, lubricants comprising an inorganic material such as boron nitride, silica, zirconia, silicon carbide or graphite as a main component, paraffin wax, and metal soap.

Among these, silicone oil, silicone oil-containing materials such as silicone greases and silicone oil compounds, and fluorine-containing lubricants or parting agents are preferred, and silicone greases and fluorine-containing lubricants or parting agents are more preferred, with silicone greases containing silicone oil having fluorine atom(s) in its molecule being particularly preferred.

When silicone oil is used as the lubricant or parting agent, high-viscosity silicone oil having a kinematic viscosity of at least 10,000 cSt at 25° C. is preferably used in that such oil can be fully retained on the surfaces of the conductive particles. If low-viscosity silicone oil having a kinematic viscosity of, for example, lower than 100 cSt at 25° C. is used, such silicone oil coated on the surfaces of the conductive particles is easy to be dispersed into the sheet-forming material upon preparation or curing of the sheet-forming material in a production process which will be described subsequently. Therefore, it is difficult to fully retain the silicone oil on the surfaces of the conductive particles.

The amount of the lubricant or parting agent coated on the surfaces of the conductive particles is preferably 10/Dn to 150/Dn parts by mass, more preferably 15/Dn to 120/Dn parts by mass, particularly preferably 20/Dn to 100/Dn parts by mass per 100 parts by mass of the conductive particles, wherein Dn means the number average diameter (μm) of the conductive particles.

In the present invention, the number average diameter of the conductive particles means a value measured by a laser diffraction scattering method.

If the amount of the lubricant or parting agent coated is too small, the conductive particles P become liable to adhere integrally to the elastic polymeric substance making up the base material, and so it may be difficult in some cases to provide an anisotropically conductive sheet high in durability upon repeated use and thermal durability. If this proportion is too high on the other hand, the strength of the resulting anisotropically conductive sheet is lowered, and no good durability may not be imparted thereto.

As the conductive particles P, conductive particles exhibiting magnetism are used from the viewpoint of the fact that they can be easily oriented so as to be arranged in the thickness-wise direction of the resulting anisotropically conductive sheet 10 by applying a magnetic field thereto. Specific examples of such conductive particles P include particles of a metal exhibiting magnetism, such as nickel, iron or cobalt, particles of alloys thereof and particles containing such a metal; particles obtained by using these particles as core particles and plating the core particles with a metal having good conductivity, such as gold, silver, palladium or rhodium; particles obtained by using particles of a non-magnetic metal, inorganic particles such as glass beads or polymer particles as core particles and plating the core particles with a conductive magnetic material such as nickel or cobalt; and particles obtained by coating the core particles with both conductive magnetic material and metal having good conductivity.

Among these, particles obtained by using particles of a ferromagnetic material, for example, nickel particles as core particles and plating them with a metal having good conductivity, particularly gold are preferably used.

No particular limitation is imposed on the means for coating the surfaces of the core particles with the conductive metal. However, the coating can be conducted by, for example, chemical plating or electroplating.

When particles obtained by coating the surfaces of core particles with the conductive metal are used as the conductive particles P, a coating rate (proportion of coated area of the conductive metal to the surface area of the core particles) of the conductive metal on the surfaces of the particles is preferably at least 40%, more preferably at least 45%, particularly preferably 47 to 95% from the viewpoint of achieving good conductivity.

The coating amount of the conductive metal is preferably 0.5 to 50% by mass, more preferably 1 to 30% by mass, still more preferably 3 to 25% by mass, particularly preferably 4 to 20% by mass based on the core particles. When the conductive metal used for the coating is gold, the coating amount of the metal is preferably 2.5 to 30% by mass, more preferably 3 to 20% by mass, still more preferably 3.5 to 17% by mass based on the core particles.

The number average particle diameter Dn of the conductive particles P is preferably 1 to 1,000 μm, more preferably 2 to 500 μm, still more preferably 5 to 300 μm, particularly preferably 10 to 200 μm.

The particle diameter distribution of the conductive particles P, i.e., a ratio (Dw/Dn) of the mass average particle diameter to the number average particle diameter is preferably 1 to 10, more preferably 1.01 to 7, still more preferably 1.05 to 5, particularly preferably 1.1 to 4.

When conductive particle P satisfying such conditions are used, the resulting conductive path-forming parts 11 become easy to deform under pressure, and sufficient electrical contact is achieved among the conductive particles.

No particular limitation is imposed on the form of the conductive particles P.

The water content in the conductive particles P is preferably at most 5%, more preferably at most 3%, still more preferably at most 2%, particularly preferably at most 1%. The use of the conductive particles satisfying such condition can prevent or inhibit the occurrence of bubbles upon the curing treatment of the polymeric substance-forming material.

The conductive particles are preferably contained in the conductive path-forming parts 11 in a proportion of 5 to 60%, more preferably 8 to 50%, particularly preferably 10 to 40% in terms of volume fraction. If this proportion is lower than 5%, the conductive path-forming parts 11 cannot be provided as those sufficiently low in electric resistance value in some cases. If the proportion exceeds 60% on the other hand, the resulting conductive path-forming parts 11 tend to become brittle, so that elasticity required for the conductive path-forming parts may not be achieved in some cases.

The electric resistance of the conductive path-forming parts 11 in the thickness-wise direction thereof is preferably at most 100 mΩ in a state that the conductive path-forming parts 11 in being pressurized under a load of 10 to 20 gf in the thickness-wise direction.

According to the anisotropically conductive sheet 11 described above, the lubricant or parting agent is applied to the surfaces of the conductive particles P, whereby the lubricant or parting agent is interposed between the conductive particles P and the elastic polymeric substance making up the base material, and so the conductive particles P and the elastic polymeric substance are prevented from adhering into integrally to each other and become a state that they can be slidably moved. Accordingly, a portion about the conductive particles P in the elastic polymeric substance is prevented from being deformed into the complicated form with the movement of the conductive particles P when the sheet is held pressurized in the thickness-wise direction thereof, whereby the stress to be applied to the portion about the conductive particles is relaxed, so that the required conductivity of the sheet is retained over a long period of time even when the sheet is used repeatedly, or it is used under a high-temperature environment. Accordingly, a long service life is achieved in the anisotropically conductive sheet owing to its high durability upon repeated use and thermal durability.

Production Process of Anisotropically Conductive Sheet

Figure 2:
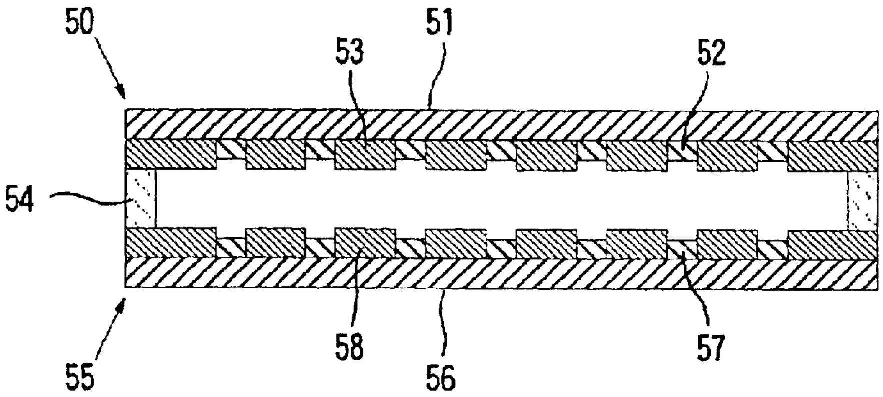
FIG. 2 is a cross-sectional view illustrating the construction of an exemplary mold used for producing an anisotropically conductive sheet according to the present invention.

FIG. 2 is a cross-sectional view illustrating the construction of an exemplary mold used for producing an anisotropically conductive sheet according to the present invention. This mold is so constructed that a top force 50 and a bottom force 55 making a pair therewith are arranged so as to be opposed to each other through a frame-like spacer 54. A mold cavity is defined between the lower surface of the top force 50 and the upper surface of the bottom force 55.

In the top force 50, ferromagnetic layer portions 52 are formed in accordance with a pattern antipodal to the arrangement pattern of the conductive path-forming parts 11 of the intended anisotropically conductive sheet 10 on the lower surface of a ferromagnetic base plate 51, and a non-magnetic layer portion or portions 53 having a thickness greater than that of the feffomagnetic layer portions 52 is formed at other area than the ferromagnetic layer portions 52.

In the bottom force 55 on the other hand, ferromagnetic layer portions 57 are formed in accordance with the same pattern as the arrangement pattern of the conductive path-forming parts 11 of the intended anisotropically conductive sheet 10 on the upper surface of a ferromagnetic base plate 56, and a non-magnetic layer portion or portions 58 having a thickness greater than that of the feffomagnetic layer portions 57 are formed at other area than the ferromagnetic portions 57.

As a material for forming the ferromagnetic base plates 51, 56 in both top force 50 and bottom force 55, may be used a ferromagnetic metal such as iron, iron-nickel alloy, iron-cobalt alloy, nickel or cobalt. The ferromagnetic base plates 51, 56 preferably each have a thickness of 0.1 to 50 mm, and are preferably smooth in surfaces thereof and subjected to a chemical degreasing treatment or mechanical polishing treatment.

As a material for forming the ferromagnetic layer portions 52, 57 in both top force 50 and bottom force 55, may be used a ferromagnetic metal such as iron, iron-nickel alloy, iron-cobalt alloy, nickel or cobalt. The ferromagnetic layer portions 52, 57 preferably each have a thickness of at least 10 $\mu$m. If the thickness is smaller than 10 $\mu$m, it is difficult to apply a magnetic field having sufficient intensity distribution to a sheet-forming material layer to be formed in the mold. As a result, it is difficult to concentrate conductive particles with high density at portions which will become conductive path-forming parts in the sheet-forming material layer, and so a sheet having good anisotropic conductivity may not be provided in some cases.

As a material for forming the non-magnetic layer portions 53, 58 in both top force 50 and bottom force 55, may be used a non-magnetic metal such as copper, a polymeric substance having heat resistance, or the like. However, a polymeric substance curable by radiation may preferably used in that the non-magnetic layer portions 53, 58 can be easily formed by a technique of photolithography. As a material therefor, may be used, for example, a photoresist such as an acrylic type dry film resist, epoxy type liquid resist or polyimide type liquid resist.

The thickness of the non-magnetic layer portions 53, 58 is preset according to the thickness of the ferromagnetic layer portions 52, 57 and the projected height of each of the conductive path-forming parts 11 of the intended anisotropically conductive sheet 10.

The anisotropically conductive sheet 10 is produced by using the above-described mold in the following manner.

A lubricant is first coated on the surfaces of conductive particles exhibiting magnetism, and the conductive particles coated with the lubricant are dispersed in a polymeric substance-forming material, which will become an elastic polymeric substance by a curing treatment, to prepare a flowable sheet-forming material.

As methods for coating the surfaces of the conductive particles with the lubricant in the above step, may be mentioned a spraying method, a method of mechanically mixing the conductive particles with the lubricant, and the like. In these coating methods, may be suitably used a method in which the lubricant is diluted with a solvent such as alcohol, the diluted solution is coated on the surfaces of the conductive particles, and the solvent is then evaporated. By such a method, the lubricant can be uniformly coated on the surfaces of the conductive particles.

The sheet-forming material may be subjected to a defoaming treatment by pressure reduction as needed.

Figure 3:
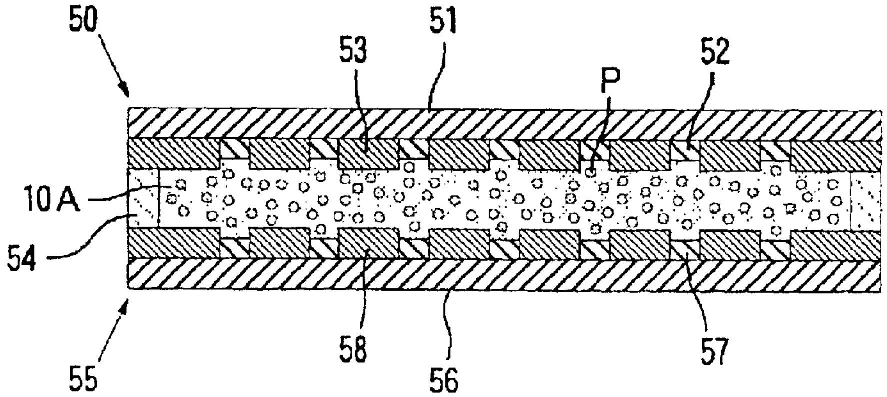
FIG. 3 is a cross-sectional view illustrating a state that a sheet-forming material layer has been formed in the mold shown in FIG. 2.

The sheet-forming material thus prepared is filled into the cavity in the mold as illustrated in FIG. 3 to form a sheet-forming material layer 10A. In this sheet-forming material layer 10A, the conductive particles P are in a state dispersed in the sheet-forming material layer 10A.

Figure 4:
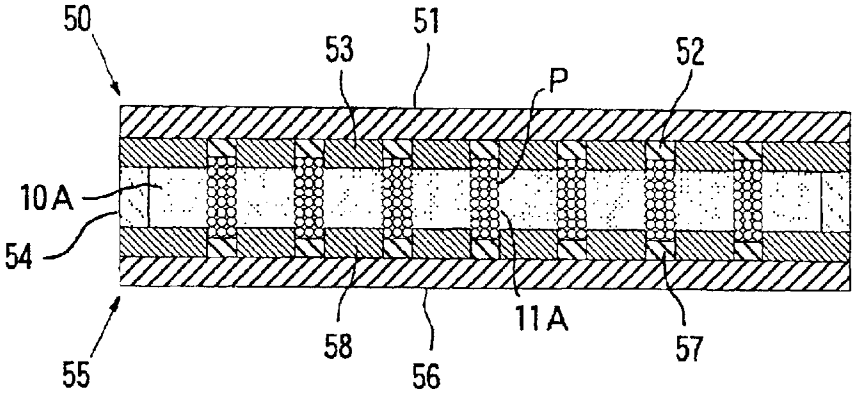
FIG. 4 is a cross-sectional view illustrating a state that conductive particles in the sheet-forming material layer have been concentrated at portions which will become conductive path-forming parts in the sheet-forming material layer.

A pair of electromagnets, for example, is then arranged on the upper surface of a ferromagnetic base plate 51 in a top force 50 and the lower surface of a ferromagnetic base plate 56 in a bottom force, and the electromagnets are operated, thereby applying a parallel magnetic field having an intensity distribution, i.e., a parallel magnetic field having higher intensity at portions 11A to become conductive path-forming parts located between ferromagnetic layer portions 52 in the top force 50 and their corresponding ferromagnetic layer portions 57 in the bottom force 55 than the other portions, to the sheet-forming material layer 10A in the thickness-wise direction thereof. As a result, in the sheet-forming material layer 10A, the conductive particles P dispersed in the sheet-forming material layer 10A are gathered at the portions to become the conductive path-forming parts and at the same time oriented so as to be arranged in the thickness-wise direction of the sheet-forming material layer 10A, as illustrated in FIG. 4.

In this state, the sheet-forming material layer 10A is subjected to a curing treatment, thereby producing an anisotropically conductive sheet 10 comprising, as illustrated in FIG. 1, conductive path-forming parts 11 arranged between the ferromagnetic layer portions 52 in the top force 50 and their corresponding ferromagnetic layer portions 57 in the bottom force 55, in which the conductive particles P are closely filled in the elastic polymeric substance in a state oriented so as to be arranged in the thickness-wise direction, and insulating part 12 composed of the elastic polymeric substance, in which the conductive particles P are not present at all or scarcely present.

In the above-described process, the curing treatment of the sheet-forming material layer 10A may be conducted in the state that the parallel magnetic field is being applied. However, the treatment may also be conducted after stopping the application of the parallel magnetic field.

The intensity of the parallel magnetic field applied to the sheet-forming material layer 10A is an intensity that it amounts to 0.02 to 2 T on the average.

As a means for applying the parallel magnetic field to the sheet-forming material layer 10A, permanent magnets may also be used in place of the electromagnets. As such a permanent magnet, are preferred those composed of alunico (Fe—Al—Ni—Co alloy), ferrite or the like in that the intensity of the parallel magnetic field within the above range is achieved.

The curing treatment of the sheet-forming material layer 10A is suitably selected according to the material used. However, the treatment is generally conducted by a heat treatment. Specific heating temperature and heating time are suitably selected in view of the kinds of materials for the polymeric substance-forming material making up the sheet-forming material layer 10A and the like, the time required for movement for gathering of the conductive particles, and the like.

According to the above-described production process of the anisotropically conductive sheet, the lubricant is applied to the surfaces of the conductive particles P, whereby the lubricant is interposed between the conductive particles P and the polymeric substance-forming material in the sheet-forming material layer 10A, so that when the curing treatment of the polymeric substance-forming material is conducted in this state, the resultant elastic polymeric substance and the conductive particles P are prevented from adhering integrally to each other and become a state that they can be slidably moved. Accordingly, in the resultant anisotropically conductive sheet, a portion about the conductive particles P in the elastic polymeric substance is prevented from being deformed into a complicated form with the movement of the conductive particles P when the sheet is held pressurized in the thickness-wise direction thereof, whereby the stress to be applied to the portion about the conductive particles is relaxed, so that the required conductivity of the sheet is retained over a long period of time even when the sheet is used repeatedly, or it is used under a high-temperature environment. Accordingly, an anisotropically conductive sheet having a long service life owing to its high durability upon repeated use and thermal durability can be produced.

Adapter for Inspection of Circuit Device

Figure 5:
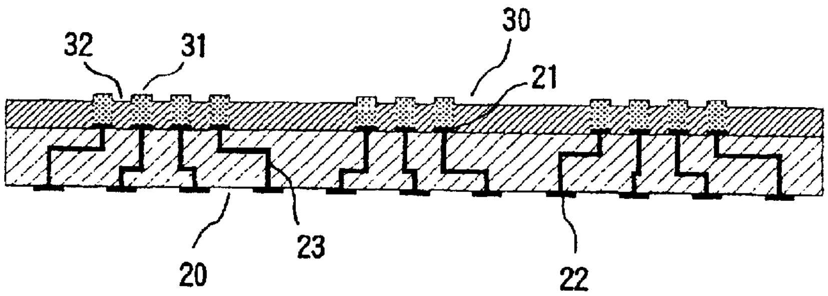
FIG. 5 is a cross-sectional view illustrating the construction of an exemplary adapter for inspection of circuit devices according to the present invention.

FIG. 5 is a cross-sectional view illustrating the construction of an exemplary adapter for inspection of circuit devices according to the present invention. The adapter for inspection of circuit devices is composed of a circuit board 20 for inspection and an anisotropically conductive sheet 30 integrally provided in a state bonded to or closely contacted with the top surface of the circuit board 20 for inspection.

Figure 6:
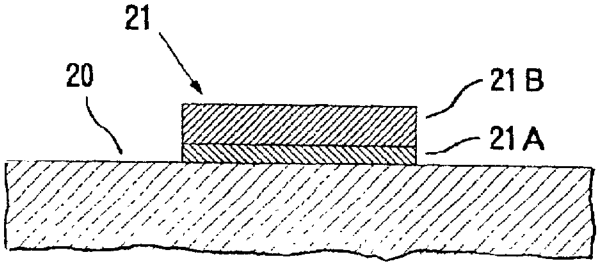
FIG. 6 is a cross-sectional view illustrating, on an enlarged scale, an electrode for inspection in a circuit board for inspection.

A plurality of electrodes 21 for inspection are arranged on the surface (upper surface in FIG. 5) of the circuit board 20 for inspection according to a pattern corresponding to electrodes to be inspected in a circuit device which is an inspection target. At least a part of each of the electrodes 21 for inspection is composed of a magnetic material. Specifically, as illustrated in FIG. 6, the electrode 21 for inspection is composed of a multi-layer structure of a base layer part 21A formed of, for example, copper, gold, silver or the like, and a surface layer part 21B formed of a magnetic material. As the magnetic material for forming the electrode 21 for inspection, may be used nickel, iron, cobalt or an alloy containing these elements. The thickness of the portion (surface layer part 21B in FIG. 6) formed of the magnetic material is, for example, 10 to 500 $\mu$m.

A plurality of terminal electrodes 22 are arranged according to a lattice-point arrangement of, for example, a pitch of 0.2 mm, 0.3 mm, 0.45 mm, 0.5 mm, 0.75 mm, 0.8 mm, 1.06 mm, 1.27 mm, 1.5 mm, 1.8 mm or 2.54 mm on the back surface of the circuit board 20 for inspection, and each of the terminal electrodes 22 is electrically connected to the electrode 21 for inspection through an internal wiring part 23.

The anisotropically conductive sheet 30 has the same construction as that of the anisotropically conductive sheet illustrated in FIG. 1 except that the surface (lower surface in FIG. 5), with which the surface of the circuit board 20 for inspection comes into contact, is formed into a shape corresponding to the surface of the circuit board 20 for inspection.

The structure of the anisotropically conductive sheet 30 will be specifically described. The anisotropically conductive sheet 30 is composed of a plurality of columnar conductive path-forming parts 31 each closely filled with conductive particles and extending in the thickness-wise direction of the sheet, and an insulating part or parts 32 in which the conductive particles are not present at all or scarcely present, and which insulate these conductive path-forming parts 31 mutually. The conductive path-forming parts 31 are respectively arranged so as to be located on the electrodes 21 for inspection of the circuit board 20 for inspection. Each of the conductive path-forming parts 31 is formed in a state projected from the surfaces (upper surface in FIG. 5) of the insulating part 32. A lubricant or parting agent is coated on the surfaces of the conductive particles.

Such an adapter for inspection of circuit devices may be produced, for example, in the following manner.

Figure 7:
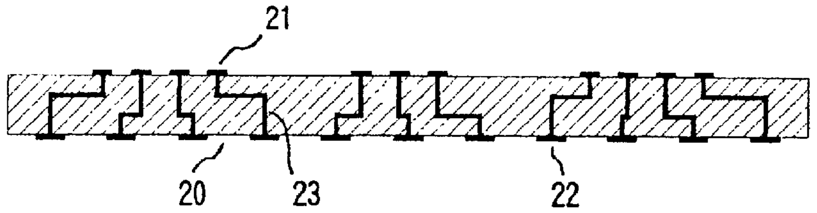
FIG. 7 is a cross-sectional view illustrating a circuit board for inspection.

A circuit board 20 for inspection composed of, for example, such a multi-layer wiring board as illustrated in FIG. 7, is first provided. As described above, this circuit board 20 for inspection has a plurality of electrodes 21 for inspection arranged on the surface thereof according to a pattern corresponding to electrodes to be inspected in a circuit device which is an inspection target, and moreover has, on its back surface, a plurality of terminal electrodes 22 arranged according to a lattice points. At least a part of each of the electrodes 21 for inspection is composed of a magnetic material, and each of the electrodes 21 for inspection is electrically connected to the terminal electrode 22 through an internal wiring part 23.

As a production process of such a circuit board 20 for inspection, a general process for producing a multi-layer wiring board may be applied as it is. No particular limitation is imposed on a process for forming the electrodes 21 for inspection at least a part of which is composed of a magnetic material. However, when the electrodes 21 for inspection of the multi-layer structure each having a surface layer part 21B composed of a magnetic material as illustrated in FIG. 6 is formed, may be used a process in which a thin copper layer is formed on a surface of a base plate with which the multi-layer wiring board is to be formed, the thin copper layer is subjected to photolithography and an etching treatment, thereby forming base layer parts 21A, and the base layer parts are then subjected to photolithography and a plating treatment with nickel or the like, thereby forming surface layer parts 21B.

Figure 8:
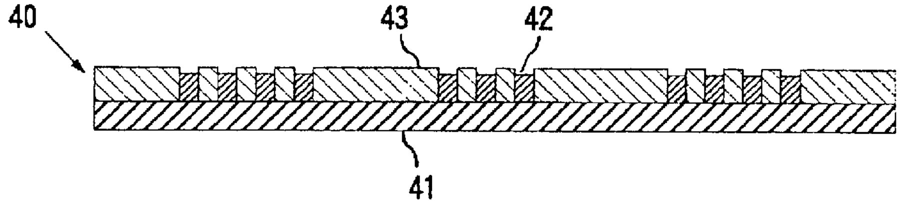
FIG. 8 is a cross-sectional view illustrating the construction of an exemplary template used for producing an anisotropically conductive sheet.

A template 40 for forming an anisotropically conductive sheet as illustrated in FIG. 8 is also provided. Specifically, this template 40 has a ferromagnetic base plate 41. On a surface of the ferromagnetic base plate 41, ferromagnetic layer portions 42 are formed according to a pattern antipodal to an arrangement pattern of the electrodes 21 for inspection in the circuit board 20 for inspection, and a non-magnetic layer portion or portions 43 having a thickness greater than that of the ferromagnetic layer portions 42 is formed at other portions than the ferromagnetic layer portions 42.

As materials for respectively forming the ferromagnetic base plate 41, ferromagnetic layer portions 42 and non-magnetic layer portion 43 in the template 40, may be used those exemplified as the materials for forming the ferromagnetic base plates 51, 56, ferromagnetic layer portions 52, 57 and non-magnetic layer portions 53, 58 in both top force 50 and bottom force 55.

Figure 9:
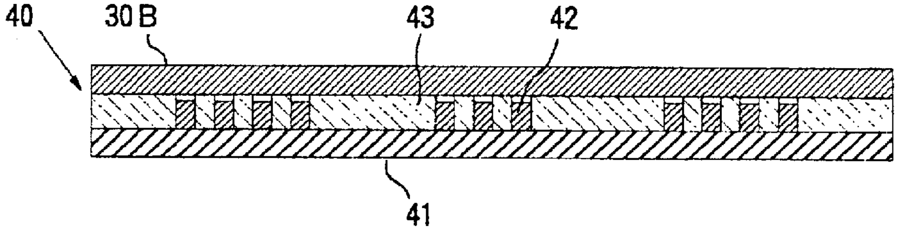
FIG. 9 is a cross-sectional view illustrating a state that an insulating elastomer layer has been formed on the surface of the template.
Figure 10:
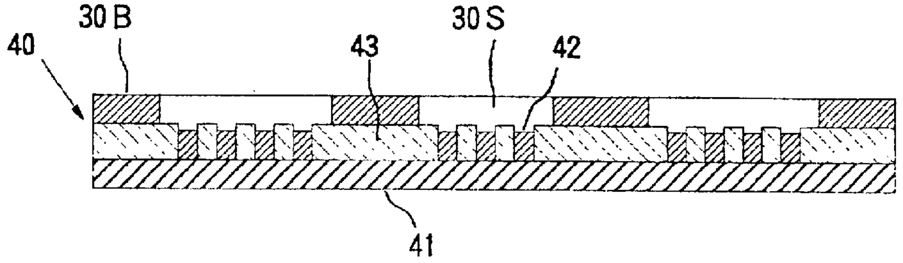
FIG. 10 is a cross-sectional view illustrating a state that spaces have been formed in the insulating elastomer layer.

As illustrated in FIG. 9, an insulating elastomer layer 30B is formed on the surface (upper surface in FIG. 9) of the template 40.

The insulating elastomer layer 30B formed on the surface of the template 40 is such that an exposed surface thereof has adhesion property. As a process for forming such an insulating elastomer layer 30B, may be used a process in which an insulating elastomer sheet having adhesion property at both surfaces thereof is provided, and the insulating elastomer sheet is bonded to the surface of the template 40, a process in which a liquid polymeric substance-forming material which will become an elastic polymeric substance by curing is coated on the surface of the template 40 to form a polymeric substance-forming material layer, and the polymeric substance-forming material layer is subjected to a curing treatment to such an extent that the adhesion property of the exposed surface thereof is not lost, or the like.

Portions of the insulating elastomer layer 30B corresponding to the regions in which the electrodes 21 for inspection in the circuit board 20 for inspection are formed, specifically, portions of the insulating elastomer layer 30B located on the ferromagnetic layer portions 42 and peripheral regions thereof in the template 40 are removed, thereby forming spaces 30S so as to expose the ferromagnetic layer portions 42 and peripheral portions thereof in the template 40.

As a method for forming the spaces 30S in the insulating elastomer layer 30, may be preferably used a method by laser machining. Examples of a laser system using in the laser machining include a carbon dioxide laser system, a YAG laser system and an excimer laser system.

Figure 11:
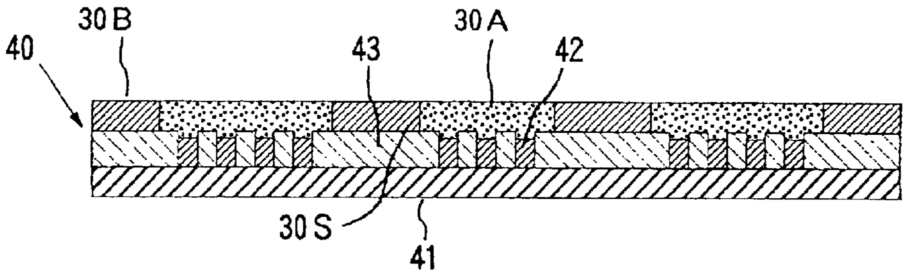
FIG. 11 is a cross-sectional view illustrating a state that a sheet-forming material layer has been formed in each of the spaces formed in the insulating elastomer layer.
Figure 12:
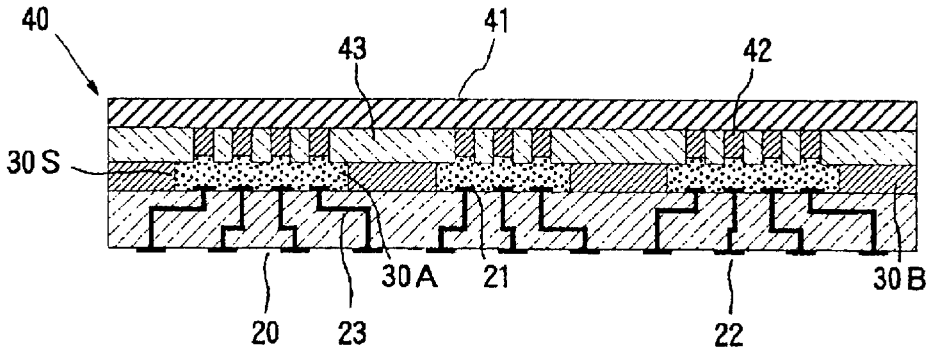
FIG. 12 is a cross-sectional view illustrating a state that the template, on which the insulating elastomer layer and the sheet-forming material layers had been formed, has been arranged on the surface of a circuit board for inspection.

On the other hand, a lubricant or parting agent is coated on the surfaces of conductive particles, and these conductive particles are dispersed in a polymeric substance-forming material, which will become an elastic polymeric substance by curing, thereby preparing a sheet-forming material. The sheet-forming material thus prepared is filled into the spaces 30S formed in the insulating elastomer layer 30B as illustrated in FIG. 11 to form sheet-forming material layer portions 30A in the spaces 30S.

The template 40, in which the sheet-forming material layer portions 30A and insulating elastomer layer 30B have been formed, is then opposed at the surfaces of the sheet-forming material layer portions 30A and insulating elastomer layer 30B to the surface of the circuit board 20 for inspection and arranged in such a manner that the ferromagnetic layer portions 42 are located on the corresponding respective electrodes 21 for inspection in the circuit board 20 for inspection.

Thereafter, electromagnets or permanent magnets are arranged on the back surface of the template 50 and the back surface of the circuit board 20 for inspection to apply a parallel magnetic field thereto in the thickness-wise direction of each sheet-forming material layer portion 30A. In this step, the ferromagnetic layer portions 42 in the template 40 and the electrodes 21 for inspection in the circuit board 20 for inspection act as magnetic poles because they are composed of a magnetic material. Therefore, a parallel magnetic field having higher intensity is applied to portions of the sheet-forming material layer portions 30A between the ferromagnetic layer portions 42 in the template 40 and the electrodes 21 for inspection in the circuit board 20 for inspection, i.e., portions to become conductive path-forming parts than the other portions. As a result, in the sheet-forming material layer portions 30A, the conductive particles exhibiting magnetism dispersed in the sheet-forming material layer portions 30A are gathered at the portions to become conductive path-forming parts and oriented so as to be arranged in the thickness-wise direction of each sheet-forming material layer portion 30A.

The sheet-forming material layer portions 30A and the insulating elastomer layer 30B are subjected to a curing treatment while the parallel magnetic field is being applied or after stopping the application of the parallel magnetic field, whereby an anisotropically conductive sheet 30 composed of a plurality of conductive path-forming parts 31 extending in the thickness-wise direction and insulating part 32, which insulates them mutually, is integrally formed on the surface of the circuit board 20 for inspection, so that an adapter for inspection of circuit devices of the construction shown in FIG. 5 is produced.

In the above description, the intensity of the parallel magnetic field applied to the sheet-forming material layer portions 30A and conditions for the curing treatment of the sheet-forming material layer portions 30A and the insulating elastomer layer 30B are the same as those in the production process of the anisotropically conductive sheet 10 described above.

According to such an adapter for inspection of circuit devices, the inspection of circuit devices can be executed with high efficiency, and moreover inspection cost can be reduced, since the anisotropically conductive sheet 30 has a long service life owing to its high durability upon repeated use and thermal durability.

Since the surface layer part 21B of each electrode 21 for inspection in the circuit board 20 for inspection is formed of a magnetic material, and thus acts as a magnetic pole when a parallel magnetic field is applied to the sheet-forming material layer portions 30A in the thickness-wise direction thereof upon the formation of the anisotropically conductive sheet 30 on the upper surface of the circuit board 20 for inspection, considerably greater magnetic lines are generated in concentration at a position on such an electrode 21 for inspection than at other positions. Therefore, even when the arrangement pitch of the electrodes 21 for inspection is extremely small, the conductive particles are gathered at positions on the electrodes 21 for inspection and oriented in the thickness-wise direction, so that the expected anisotropically conductive sheet 30 having a plurality of conductive path-forming parts 31 arranged on the electrodes 21 for inspection and mutually insulated by the insulating part 22 can be formed. Accordingly, even when the arrangement pitch of electrodes to be inspected in a circuit device to be inspected is extremely small, and a pattern thereof is fine, high-density and complicated, the required electrical connection of such electrodes to be inspected to the electrodes for inspection in the circuit board 20 for inspection can be achieved with certainty.

Since the anisotropically conductive sheet 30 is integrally provided on the circuit board 20 for inspection, the thermal expansion of the anisotropically conductive sheet 30 caused upon heating of the adapter for inspection of circuit devices is inhibited by the circuit board 20 for inspection. Accordingly, a good electrically connected state can be stably retained even at varied temperatures in a test such as a heat cycle test or burn-in test.

Inspection Apparatus for Circuit Devices

Figure 13:
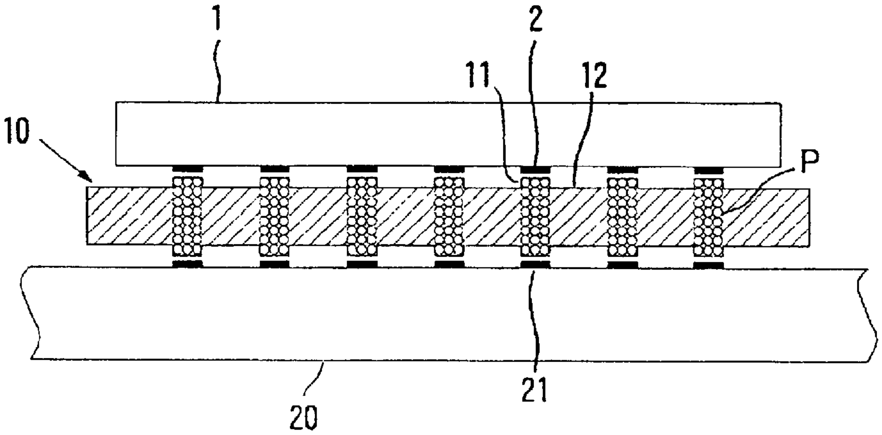
FIG. 13 is a cross-sectional view illustrating the construction of a main portion of an exemplary inspection apparatus for circuit devices according to the present invention.

FIG. 13 is a cross-sectional view illustrating the construction of an exemplary inspection apparatus for circuit devices according to the present invention.

In FIG. 13, reference numeral 20 designates a circuit board for inspection on the surface (upper surface in FIG. 13) of which a plurality of electrodes 21 for inspection are formed in accordance with a pattern corresponding to electrodes 2 to be inspected of a circuit device 1 to be inspected. On the surface of the circuit board 20 for inspection, an anisotropically conductive sheet 10 of the structure shown in FIG. 1 is arranged and fixed by a proper means (not illustrated). Specifically, the anisotropically conductive sheet 10 has a plurality of conductive path-forming parts 11 formed in accordance with a pattern corresponding to the electrodes 2 to be inspected of the circuit device 1 to be inspected, and each of the conductive path-forming parts 11 is arranged so as to be located on its corresponding electrode 21 for inspection in the circuit board 20 for inspection.

Examples of the circuit device to be inspected, which is an inspection target, include wafers, semiconductor chips, packages such as BGA and CSP, electronic parts such as modules such as MCM and printed circuit boards such as single-side printed circuit boards, double-side printed circuit boards and multi-layer printed circuit boards.

In such an inspection apparatus, the anisotropically conductive sheet 10 is pressed by the circuit device 1 to be inspected and the circuit board 20 for inspection, for example, by moving the circuit board 20 for inspection in a direction coming close to the circuit device 1 to be inspected, or by moving the circuit device 1 to be inspected in a direction coming close to the circuit board 20 for inspection. As a result, electrical connection between the electrodes 2 to be inspected in the circuit device 1 to be inspected and the electrodes 21 for inspection in the circuit board 20 for inspection is achieved through the conductive path-forming parts 11 in the anisotropically conductive sheet 10.

In this state, or in a state that the environmental temperature is raised to a predetermined temperature, for example, 150° C. for the purpose of developing latent defects of such a circuit device 1, electrical inspection required of the circuit device 1 to be inspected is conducted.

According to such an inspection apparatus, the frequency of exchanging the anisotropically conductive sheet 10 becomes a little because the anisotropically conductive sheet 10 has a long service life owing to its high durability upon repeated use and thermal durability. As a result, the inspection of the circuit devices can be executed with high efficiency.

Figure 14:
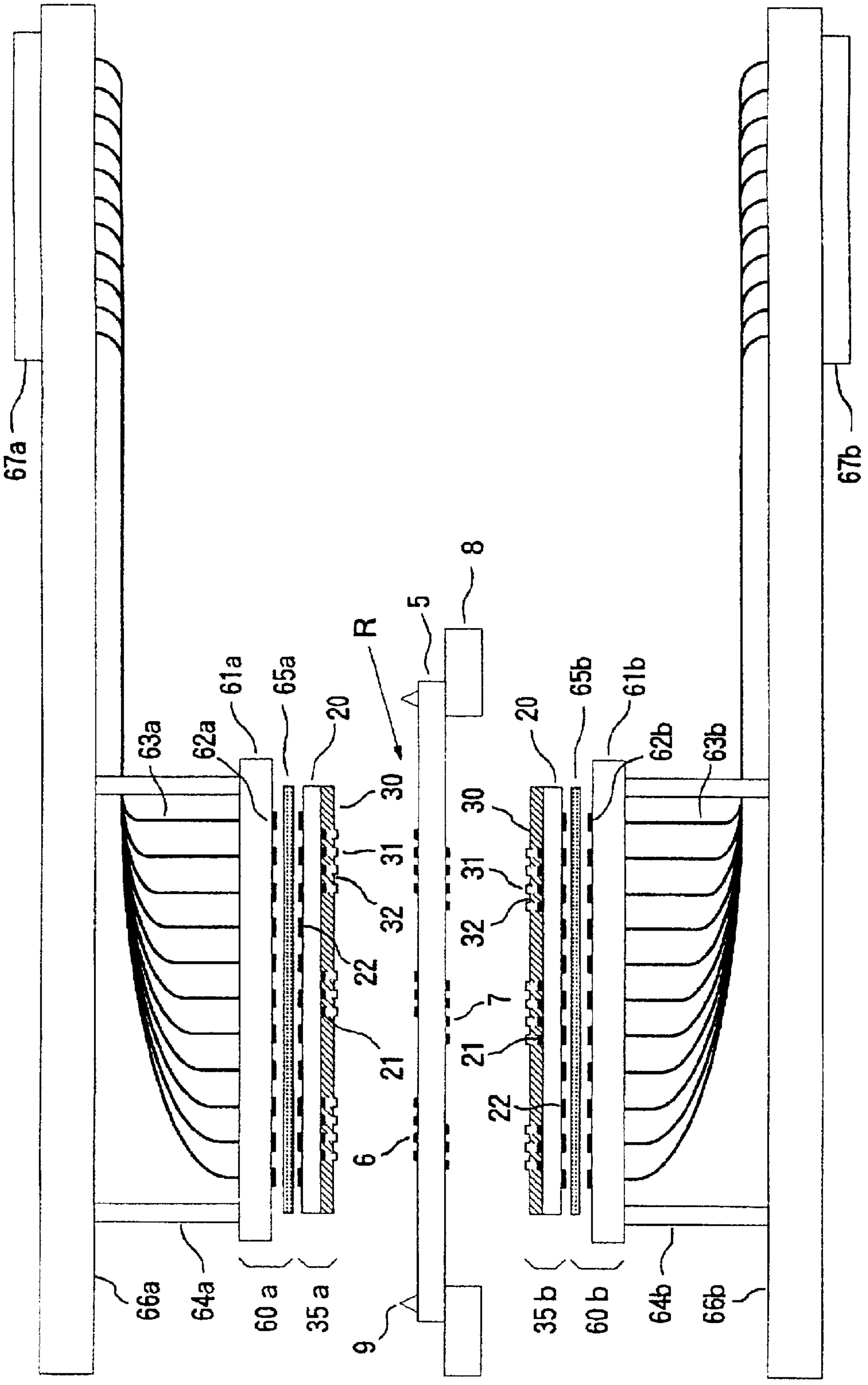
FIG. 14 is a cross-sectional view illustrating the construction of another exemplary inspection apparatus for circuit devices according to the present invention.

FIG. 14 is a cross-sectional view illustrating the construction of another exemplary inspection apparatus for circuit devices according to the present invention. This inspection apparatus serves to conduct electrical inspection of a circuit board 5 to be inspected, on both surfaces of which electrodes 6, 7 to be inspected are formed, and has a holder 8 for holding the circuit board 5 to be inspected in an inspection-executing region R. This holder 8 is provided with positioning pins 9 for arranging the circuit board 5 to be inspected at a proper position in the inspection-executing region R. Above the inspection-executing region R, an upper-side adapter 35*a* of such a structure as shown in FIG. 5 and an upper-side inspection head 60*a* are provided in that order from below. On the upper-side inspection head 60*a*, an upper-side supporting plate 66*a* is arranged, and the upper-side inspection head 60*a* is fixed to the supporting plate 66*a* by columns 64*a*. On the other hand, below the inspection-executing region R, a lower-side adapter 35*b* of such a structure as shown in FIG. 5 and a lower-side inspection head 60*b* are provided in that order from above. Under the lower-side inspection head 60*b*, a lower-side supporting plate 66*b* is arranged, and the lower-side inspection head 60*b* is fixed to the supporting plate 66*b* by columns 64*b*.

The upper-side inspection head 60*a* is composed of a plate-like electrode device 61*a* and an elastic anisotropically conductive sheet 65*a* arranged on and fixed to the lower surface of the electrode device 61*a*. The electrode device 61*a* has, on the lower surface thereof, a plurality of electrodes 62*a* for connection arranged at lattice-point positions of the same pitch as the terminal electrodes 22 in the upper-side adapter 35*a*. Each of the electrodes 62*a* for connection is electrically connected to a connector 67*a* provided on the upper-side supporting plate 66*a* through a lead wire 63*a* and further to an inspection circuit (not illustrated) of a tester through this connector 67*a*.

The lower-side inspection head 60*b* is composed of a plate-like electrode device 61*b* and an elastic anisotropically conductive sheet 65*b* arranged on and fixed to the upper surface of the electrode device 61*b*. The electrode device 61*b* has, on the upper surface thereof, a plurality of electrodes 62*b* for connection arranged at lattice-point positions of the same pitch as the terminal electrodes 22 in the lower-side adapter 35*b*. Each of the electrodes 62*b* for connection is electrically connected to a connector 67*b* provided on the lower-side supporting plate 66*b* through a lead wire 63*b* and further to the inspection circuit (not illustrated) of the tester through this connector 67*b*.

In each of the anisotropically conductive sheets 65*a* and 65*b* in the upper-side inspection head 60*a* and the lower-side inspection head 60*b*, conductive path-forming parts which each forms a conductive path only in the thickness-wise direction thereof are formed. As such anisotropically conductive sheets 65*a* and 65*b*, are preferred those that each of the conductive path-forming parts is formed so as to project from the surface in the thickness-wise direction in at least one side thereof in that high stability of electrical connection is exhibited.

In such an inspection apparatus for circuit devices, the circuit board 5 to be inspected, which is an inspection target, is held in the inspection-executing region R by the holder 8. In this state, both upper-side supporting plate 66*a* and lower-side supporting plate 66*b* are moved in directions coming close to the circuit board 5 to be inspected, whereby the circuit board 5 to be inspected is held pressurized by the upper-side adapter 35*a* and the lower-side adapter 35*b*.

In this state, the electrodes 6 to be inspected on the upper surface of the circuit board 5 to be inspected are electrically connected to the electrodes 21 for inspection in the upper-side adapter 35*a* through the conductive path-forming parts 31 in the anisotropically conductive sheet 30, and the terminal electrodes 22 in the upper-side adapter 35*a* are electrically connected to the electrodes 62*a* for connection in the electrode device 61*a* through the anisotropically conductive sheet 65*a*. On the other hand, the electrodes 7 to be inspected on the lower surface of the circuit board 5 to be inspected are electrically connected to the electrodes 21 for inspection in the lower-side adapter 35*b* through the conductive path-forming parts 31 in the anisotropically conductive sheet 30, and the terminal electrodes 22 in the lower-side adapter 35*b* are electrically connected to the electrodes 62*b* for connection in the electrode device 61*b* through the anisotropically conductive sheet 65*b*.

In such a manner, both electrodes 6 and 7 to be inspected provided on the upper and lower surfaces of the circuit board 5 to be inspected are electrically connected respectively to the electrodes 62*a* for connection of the electrode device 61*a* in the upper-side inspection head 60*a* and the electrodes 62*b* for connection of the electrode device 61*b* in the lower-side inspection head 60*b*, whereby a state electrically connected to the inspection circuit of the tester is achieved. In this state, the required electrical inspection is conducted.

According to the above-described inspection apparatus for circuit boards, inspection of circuit devices can be executed with high efficiency, and moreover inspection cost can be reduced, since the upper-side adapter 35*a* and the lower-side adapter, which each have the anisotropically conductive sheet 30 high in durability upon repeated use and thermal durability, are provided.

In each of the upper-side adapter 35*a* and the lower-side adapter 35*b*, the anisotropically conductive sheet 30 is integrally provided on the circuit board 20 for inspection, and so the thermal expansion of the anisotropically conductive sheet 30 is inhibited by the circuit board 20 for inspection. Accordingly, a good electrically connected state can be stably retained even at varied temperatures.

Electronic Part-packaged Structure

Figure 15:
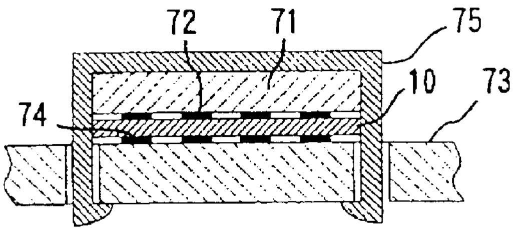
FIG. 15 is a cross-sectional view illustrating the construction of an exemplary electronic part-packaged structure according to the present invention.

FIG. 15 is a cross-sectional view illustrating the construction of an exemplary electronic part-packaged structure according to the present invention. In the electronic part-packaged structure, an electronic part 71 is arranged on a circuit board 73 through an anisotropically conductive sheet 10 of the structure shown in FIG. 1. The anisotropically conductive sheet 10 is fixed by a fixing member 75 in a state held pressurized by the electronic part 71 and the circuit board 73. Electrodes 72 in the electronic part 71 are electrically connected to electrodes 74 in the circuit board 73 through conductive path-forming parts (not shown) in the anisotropically conductive sheet 10.

No particular limitation is imposed on the electronic part, and various electronic parts may be used. Examples thereof include active parts composed of each of semiconductor devices such as transistors, diodes, relays, switches, IC chips or LSI chips or packages thereof, and MCM (multi chip module); passive parts such as resistors, capacitors, quartz oscillators, speakers, microphones, transformers (coils) and inductors; and display panels such as TFT type liquid crystal display panels, STN type liquid crystal display panels, plasma display panels and electroluminescence panels.

As the circuit board 73, may be used any of various structures such as single-side printed circuit boards, double-side printed circuit boards and multi-layer printed circuit boards. The circuit board 73 may be any of a flexible board, a rigid board and a flexible-rigid board composed of a combination thereof.

As a material for forming the flexible board, may be used polyimide, polyamide, polyester, polysulfone or the like.

As a material for forming the rigid board, may be used a composite resin material such as a glass fiber-reinforced epoxy resin, glass fiber-reinforced phenol resin, glass fiber-reinforced polyimide resin or glass fiber-reinforced bismaleimidotriazine resin, or a ceramic material such as silicon dioxide or alumina.

Examples of a material for the electrodes 72 in the electronic part 71 and the electrodes 74 in the circuit board 73 include gold, silver, copper, nickel, palladium, carbon, aluminum and ITO.

The thicknesses of the electrodes 72 in the electronic part 71 and the electrodes 74 in the circuit board 73 are each preferably 0.1 to 100 $\mu$m.

The widths of the electrodes 72 in the electronic part 71 and the electrodes 74 in the circuit board 73 are each preferably 1 to 500 $\mu$m.

According to the electronic part-packaged structure described above, a good electrically connected state can be stably retained over a long period of time because the electronic part 71 is electrically connected to the circuit board 73 through the anisotropically conductive sheet 10 high in durability upon repeated use and thermal durability.

Such an electronic part-packaged structure may be applied to packaged structures of a printed circuit board and an electronic part in fields of electronic computers, electronic digital clocks, electronic cameras, computer key boards, etc.

The present invention is not limited to the above-described embodiments, and various modifications may be added thereto.

Figure 16:
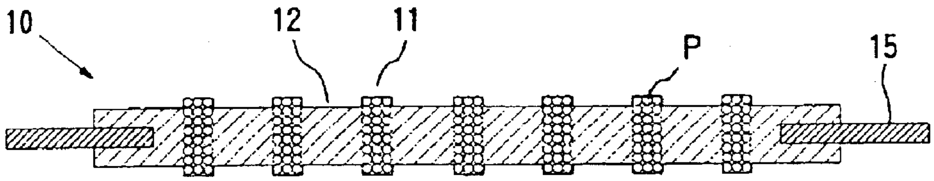
FIG. 16 is a cross-sectional view illustrating the construction of an exemplary anisotropically conductive sheet according to the present invention, which is equipped with a support.
Figure 17:
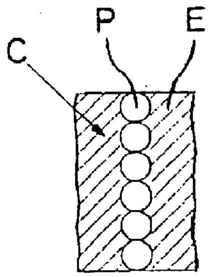
FIG.17 PRIOR ART
FIG. 17 is a cross-sectional view typically illustrating a state of conductive particles in a conventional anisotropically conductive sheet.
Figure 18:
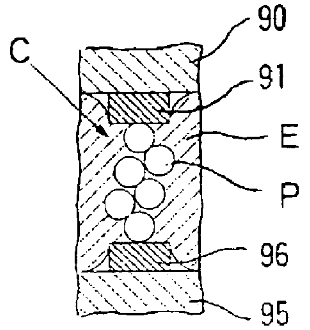
FIG.18 PRIOR ART
FIG. 18 is a cross-sectional view typically illustrating a state of the conductive particles in the case where the conventional anisotropically conductive sheet shown in FIG. 17 has been pressurized in the thickness-wise direction thereof.

(1) As illustrated in FIG. 16, a support-equipped anisotropically conductive sheet 10 with a peripheral part thereof supported by a frame-like support 15 may be constructed.

Such an anisotropically conductive sheet 10 can be produced by using a mold having a space region for arrangement of the support, by which the support 15 can be arranged in a cavity, as a mold for producing the anisotropically conductive sheet, arranging the support 15 in the space region for arrangement of the support in the cavity of the mold, and in this state, charging a sheet-forming material into the mold as described above to conduct a curing treatment.

(2) In the present invention, it is not essential to form the conductive path-forming parts 11 in a state projected from the surface of the insulating part 12. Therefore, the surface of the anisotropically conductive sheet 10 may be flat or smooth.

(3) The anisotropically conductive sheet may also be constructed as the so-called dispersed type or even distribution type in which conductive particles are contained in a base material in a state evenly distributed in a plane direction thereof.

The present invention will hereinafter be described specifically by the following examples. However, the present invention is not limited to these examples.

In the following examples, the number average particle diameter of particles was measured by a laser diffraction scattering method, and the durometer hardness of rubber after curing was measured by means of a Type A durometer on the basis of the durometer hardness test prescribed in JIS K 6253.

EXAMPLE 1

Preparation of Sheet-forming Material

Conductive particles (number average particle diameter: 30 $\mu$m) were prepared by plating surfaces of nickel particles having a number average particle diameter of 30 $\mu$m with gold in an amount of 8% by mass based on the mass of the particles. The surfaces of the conductive particles were coated with a lubricant in an amount of 5 parts by mass per 100 parts by mass of the conductive particles. As the lubricant, was used silicone grease “FG721” (product of Shin-Etsu Chemical Co., Ltd.) containing silicone oil having fluorine atom(s) in its molecule.

Nine parts by mass of the conductive particles coated with the lubricant were then added to and mixed with 100 parts by mass of addition type liquid silicone rubber “KE2000-40” (product of Shin-Etsu Chemical Co., Ltd.; durometer hardness after curing: 40). Thereafter, the resultant mixture was subjected to a defoaming treatment by pressure reduction, thereby preparing a sheet-forming material.

Fabrication of Mold for Production of Anisotropically Conductive Sheet

A mold for production of anisotropically conductive sheets was fabricated under the following conditions in accordance with the construction basically shown in FIG. 2 except that a space region for arrangement of a support was provided in a cavity.

Ferromagnetic base plate: material; iron, thickness; 6 mm

Ferromagnetic layer: material; nickel, thickness; 0.15 mm, diameter; 0.4 mm, pitch (center distance); 0.8 mm Material of non-magnetic layer: epoxy resin, thickness; 0.2 mm, Thickness of spacer; 0.3 mm Production of Anisotropically Conductive Sheet A frame-like support for anisotropically conductive sheet composed of stainless steel and having a thickness of 0.3 mm was arranged in the space region for arrangement of the support within the cavity of the mold. The sheet-forming material prepared was then charged into the cavity of the mold and subjected to a defoaming treatment by pressure reduction, thereby forming a sheet-forming material layer in the mold.

While applying a parallel magnetic field of 2 T to the sheet-forming material layer by electromagnets, the sheet-forming material layer was subjected to a curing treatment under conditions of 100° C. for 1 hour. After removing it from the mold, post curing was conducted under conditions of 150° C. for 1 hour, thereby producing a support-equipped anisotropically conductive sheet having a plurality of conductive path-forming parts each extending in the thickness-wise direction of the sheet, and insulating part insulating the conductive path-forming parts mutually.

The anisotropically conductive sheet thus obtained was such that the conductive path-forming parts each having an external diameter of 0.4 mm were arranged at lattice-point positions of 12 lines and 9 rows at a pitch of 0.8 mm. The thickness of the insulating part was 0.3 mm, the thickness of each of the conductive path-forming parts was 0.4 mm, and the conductive path-forming parts were formed in a state projected (each projected height: 0.05 mm) from both surfaces of the insulating part. A proportion of the conductive particles in the conductive path-forming parts was 30% in terms of volume fraction.

EXAMPLE 2

A support-equipped anisotropically conductive sheet was produced in the same manner as in Example 1 except that silicone grease "G501" (product of Shin-Etsu Chemical Co., Ltd.) containing silicone oil having no fluorine atoms in its molecule was used as a lubricant in place of silicone grease "FG721", and surfaces of the conductive particles were coated with the lubricant in an amount of 2.5 parts by mass per 100 parts by mass of the conductive particles. The dimensions of the conductive path-forming parts and the insulating part in the resultant anisotropically conductive sheet were the same as the anisotropically conductive sheet according to Example 1. A proportion of the conductive particles in the conductive path-forming parts was 30% in terms of volume fraction.

EXAMPLE 3

A support-equipped anisotropically conductive sheet was produced in the same manner as in Example 1 except that a fluorine-containing parting agent "Daifree" (product of Daikin Industries, Ltd.) was used as a parting agent in place of silicone grease "FG721", and surfaces of the conductive particles were coated with the parting agent in an amount of 2.5 parts by mass per 100 parts by mass of the conductive particles. The dimensions of the conductive path-forming parts and the insulating part in the resultant anisotropically conductive sheet were the same as the anisotropically conductive sheet according to Example 1. A proportion of the conductive particles in the conductive path-forming parts was 30% in terms of volume fraction.

EXAMPLE 4

A support-equipped anisotropically conductive sheet was produced in the same manner as in Example 1 except that silicone oil "KF96H" (product of Shin-Etsu Chemical Co., Ltd.) having a kinetic viscosity of 300,000 cSt at 25° C. was used as a lubricant in place of silicone grease "FG721", and surfaces of the conductive particles were coated with the lubricant in an amount of 2.5 parts by mass per 100 parts by mass of the conductive particles. The dimensions of the conductive path-forming parts and the insulating part in the resultant anisotropically conductive sheet were the same as the anisotropically conductive sheet according to Example 1. A proportion of the conductive particles in the conductive path-forming parts was 30% in terms of volume fraction.

Comparative Example 1

A support-equipped anisotropically conductive sheet was produced in the same manner as in Example 1 except that surfaces of the conductive particles were not coated with the lubricant. The dimensions of the conductive path-forming parts and the insulating part in the resultant anisotropically conductive sheet were the same as the anisotropically conductive sheet according to Example 1. A proportion of the conductive particles in the conductive path-forming parts was 30% in terms of volume fraction.

Comparative Example 2

A support-equipped anisotropically conductive sheet was produced in the same manner as in Example 1 except that addition type liquid silicone rubber "KE2000-20" (product of Shin-Etsu Chemical Co., Ltd.; durometer hardness after curing: 18) was used in place of the addition type liquid silicone rubber "KE2000-40". The dimensions of the conductive path-forming parts and the insulating part in the resultant anisotropically conductive sheet were the same as the anisotropically conductive sheet according to Example 1. A proportion of the conductive particles in the conductive path-forming parts was 30% in terms of volume fraction.

Referential Example 1

A support-equipped anisotropically conductive sheet was produced in the same manner as in Example 1 except that silicone oil "KF96L" (product of Shin-Etsu Chemical Co., Ltd.) having a kinetic viscosity of 2 cSt at 25° C. was used in place of silicone grease "FG721", and surfaces of the conductive particles were coated with the lubricant in an amount of 2.5 parts by mass per 100 parts by mass of the conductive particles. The dimensions of the conductive path-forming parts and the insulating part in the resultant anisotropically conductive sheet were the same as the anisotropically conductive sheet according to Example 1. A proportion of the conductive particles in the conductive path-forming parts was 30% in terms of volume fraction.

Referential Example 2

A support-equipped anisotropically conductive sheet was produced in the same manner as in Example 1 except that surfaces of the conductive particles were coated with the lubricant in an amount of 20 parts by mass per 100 parts by mass of the conductive particles. The dimensions of the conductive path-forming parts and the insulating part in the resultant anisotropically conductive sheet were the same as the anisotropically conductive sheet according to Example 1. A proportion of the conductive particles in the conductive path-forming parts was 30% in terms of volume fraction.

Evaluation of Anisotropically Conductive Sheets

With respect to the anisotropically conductive sheets according to Examples 1 to 4, Comparative Examples 1 and 2, and Referential Examples 1 and 2, the durability upon repeated use and the thermal durability were evaluated in the following manner.

(1) Durability upon Repeated Use

A first and second circuit boards for evaluation were provided. The first circuit board for evaluation had ejected electrodes made of gold, which were arranged at 15 lines and 15 rows according to lattice-point positions at a pitch of 0.8 mm on one surface of an insulating base plate made of a BT resin having a thickness of 0.5 mm and each had a height of 20 μm and an external diameter of 0.25 mm, and lead electrodes electrically connected to the respective ejected electrodes through printed wiring at a peripheral portion on one surface of the insulating base plate. The second circuit board for evaluation had flat electrodes made of gold, which were arranged at 20 lines and 20 rows according to lattice-point positions at a pitch of 0.8 mm on one surface of an insulating base plate made of a BT resin having a thickness of 0.5 mm and each had an external diameter of 0.3 mm, and lead electrodes electrically connected to the respective flat electrodes through printed wiring at a peripheral portion on one surface of the insulating base plate. An anisotropically conductive sheet sample was arranged between the first and second circuit boards for evaluation in such a manner that the conductive path-forming parts thereof were located between the respective ejected electrodes and flat electrodes.

The anisotropically conductive sheet was held pressurized by the first and second circuit boards for evaluation under a temperature environment of 130° C. in such a manner that a load applied to one conductive path-forming part was 10 gf. In this state, the electrical resistance of each of the conductive path-forming parts was measured by the four probe method. Thereafter, the load applied to the conductive path-forming parts was changed to 0 gf. This process was determined to be a cycle and repeated to count the number of cycles (this is referred to as "repeated durable runs") by the electrical resistance value of any conductive path-forming part exceeds 1 Ω.

The initial electrical resistances (electrical resistance values measured in the first cycle) of the conductive path-forming parts and the repeated durable times in the anisotropically conductive sheets are shown in Table 1.

(2) Thermal Durability

The first and second circuit boards for evaluation as used in the item (1) were used, and an anisotropically conductive sheet sample was arranged between the first and second circuit boards for evaluation in such a manner that the conductive path-forming parts thereof were located between the respective ejected electrodes and flat electrodes, and was held pressurized by said circuit boards for evaluation in a state that a load applied to one conductive path-forming part was 10 gf.

In this state, the sheet was kept at 25° C. for 1 hour in a thermostat controlled in accordance with a temperature control program, and the initial electrical resistance of each of the conductive path-forming parts at 25° C. was then measured by the four probe method. Thereafter, the sheet was kept at 150° C. for 2 hours, and the initial electrical resistance of each of the conductive path-forming parts at 150° C. was then measured by the four probe method.

Thereafter, the process that the sheet was kept at 25° C. for 1 hour and then kept at 150° C. for 2 hours (this process is determined to be a cycle) was repeated, and the electrical resistance of each of the conductive path-forming parts was measured every after completion of the cycle to count the number of cycles (this is referred to as "thermal durable runs") by the electrical resistance value of any conductive path-forming part exceeds 1 Ω.

The results are shown in Table 1.

As apparent from the results shown in Table 1, according to the anisotropically conductive sheets of Examples 1 to 4, an increase in electrical resistance at the conductive path-forming parts is small either upon repeated use under normal environment or upon long-time use under high-temperature environment, and so it was confirmed that a long service life can be achieved in these sheets owing to their high durability upon repeated use and thermal durability.

EXAMPLE 5

Fabrication of Circuit Board for Inspection

A circuit board for inspection having the following electrodes for inspection and terminal electrodes was fabricated in accordance with the construction shown in FIGS. 6 and 7.

(1) Electrodes for Inspection

Electrode diameter; 150 μm, pitch; 500 μm, material of base layer part; copper, thickness of base layer part; 30 μm, material of surface layer part; nickel, thickness of surface layer part; 70 μm, number of electrodes; 512

(2) Terminal electrodes

Electrode diameter; 500 μm, pitch; 800 μm, material; copper, number of electrodes; 512

Preparation of Sheet-forming Material

Conductive particles (number average particle diameter: 20 μm) were prepared by plating surfaces of nickel particles having a number average particle diameter of 20 μm with gold in an amount of 8% by mass based on the mass of the particles. The surfaces of the conductive particles were coated with a lubricant in an amount of 2.5 parts by mass per 100 parts by mass of the conductive particles. As the lubricant, was used silicone grease "FG721" (product of Shin-Etsu Chemical Co., Ltd.) containing silicone oil having fluorine atom(s) in its molecule.

Eight parts by mass of the conductive particles coated with the lubricant were then added to and mixed with 100 parts by mass of addition type liquid silicone rubber "KE2000-40" (product of Shin-Etsu Chemical Co., Ltd.; durometer hardness after curing: 40). Thereafter, the resultant mixture was subjected to a defoaming treatment by pressure reduction, thereby preparing a sheet-forming material.

TABLE 1

| | Durometer Hardness of Elastic Polymeric Substance | Coated amount of Lubricant or Parting Agent by mass per 100 parts by mass of Conductive Particles | Repeated Durability: Initial Electrical Resistance (Ω) | Repeated Durability: Repeated Durable Runs | Thermal Durability: Initial Electrical Resistance (Ω) 25° C. | Thermal Durability: Initial Electrical Resistance (Ω) 150° C. | Thermal Durability: Thermal Durable Runs |
|---|---|---|---|---|---|---|---|
| Example 1 | 40 | 5 | 0.2 | 500000 | 0.2 | 0.5 | 700 |
| Example 2 | 40 | 2.5 | 0.2 | 450000 | 0.2 | 0.6 | 600 |
| Example 3 | 40 | 2.5 | 0.2 | 400000 | 0.2 | 0.6 | 400 |
| Example 4 | 40 | 2.5 | 0.2 | 300000 | 0.2 | 0.6 | 350 |
| Comparative Example 1 | 40 | 0 | 0.4 | 100000 | 0.3 | 0.8 | 160 |
| Comparative Example 2 | 18 | 2.5 | 0.5 | 20000 | 0.5 | 0.7 | 50 |
| Referential Example 1 | 40 | 2.5 | 0.4 | 150000 | 0.3 | 0.7 | 200 |
| Referential Example 2 | 40 | 20.0 | 1.5 | 10000 | 1.5 | 2.5 | 20 |

Fabrication of Template for Molding of Anisotropically Conductive Sheet

A template for molding of anisotropically conductive sheet was fabricated under the following conditions in accordance with the construction shown in FIG. 8.

Ferromagnetic base plate: material; iron, thickness; 6 mm

Ferromagnetic layer: material; nickel, thickness; 0.05 mm, diameter; 0.15 mm, pitch (center distance); 0. 5 mm Material of non-magnetic layer: epoxy resin, thickness; 0.11 mm Production of Adapter for Inspection of Circuit Devices An insulating elastomer sheet having adhesion property at both surfaces thereof and a thickness of 150 μm was bonded to the surface of the template described above to form an insulating elastomer layer. Thereafter, portions of the insulating elastomer layer located on the ferromagnetic layer portions and peripheral regions thereof in the template were removed by a carbon dioxide laser system, thereby forming spaces so as to expose the ferromagnetic layer portions and peripheral portions thereof in the template. The sheet-forming material prepared was filled into the spaces formed in the insulating elastomer layer by a screen printing process to form sheet-forming material layer portions in the spaces.

The template, in which the sheet-forming material layer portions and insulating elastomer layer portions had been formed, was then opposed at the surfaces of the sheet-forming material layer portions and insulating elastomer layer portions to the surface of the circuit board for inspection and arranged in such a manner that the ferromagnetic layer portions were located on the respective corresponding electrodes for inspection in the circuit board for inspection.

While applying a parallel magnetic field of 0.7 T to the sheet-forming material layer by electromagnets, the sheet-forming material layer was subjected to a curing treatment under conditions of 100° C. for 1 hour. After removing it from the template, post curing was conducted under conditions of 150° C. for 1 hour, thereby integrally forming an anisotropically conductive sheet having a plurality of conductive path-forming parts each extending in the thickness-wise direction of the sheet, and insulating part insulating the conductive path-forming parts mutually on the surface of the circuit board for inspection to thus produce an adapter for inspection of circuit devices.

The anisotropically conductive sheet in the adapter for inspection of circuit devices thus obtained was such that the conductive path-forming parts had an external diameter of 0.15 mm and a pitch of 0.5 mm, the projected height of the conductive path-forming parts from the surface of the insulating part was 58 μm, the thickness of the insulating part was 150 μm, and a proportion of the conductive particles in the conductive path-forming parts was 30% in terms of volume fraction.

Comparative Example 3

An adapter for inspection of circuit devices was produced in the same manner as in Example 5 except that surfaces of the conductive particles were not coated with the lubricant. The dimensions of the conductive path-forming parts and the insulating part of the anisotropically conductive sheet in the resultant adapter for inspection of circuit devices were the same as in the adapter for inspection of circuit devices according to Example 5. A proportion of the conductive particles in the conductive path-forming parts was 30% in terms of volume fraction.

Comparative Example 4

An adapter for inspection of circuit devices was produced in the same manner as in Example 5 except that surfaces of the conductive particles were not coated with the lubricant, and a titanium coupling agent was added to the sheet-forming material in an amount of 0.3 parts by mass per 100 parts by mass of the addition type liquid silicone. The dimensions of the conductive path-forming parts and the insulating part of the anisotropically conductive sheet in the resultant adapter for inspection of circuit devices were the same as in the adapter for inspection of circuit devices according to Example 5. A proportion of the conductive particles in the conductive path-forming parts was 30% in terms of volume fraction.

Comparative Example 5

An adapter for inspection of circuit devices was produced in the same manner as in Example 5 except that addition type liquid silicone rubber "KE2000-20" (product of Shin-Etsu Chemical Co., Ltd.; durometer hardness after curing: 18) was used in place of the addition type liquid silicone rubber "KE2000-40". The dimensions of the conductive path-forming parts and the insulating part of the anisotropically conductive sheet in the resultant adapter for inspection of circuit devices were the same as in the adapter for inspection of circuit devices according to Example 5. A proportion of the conductive particles in the conductive path-forming parts was 30% in terms of volume fraction.

Referential Example 3

An adapter for inspection of circuit devices was produced in the same manner as in Example 5 except that surfaces of the conductive particles were coated with the lubricant in an amount of 20 parts by mass per 100 parts by mass of the conductive particles. The dimensions of the conductive path-forming parts and the insulating part of the anisotropically conductive sheet in the resultant adapter for inspection of circuit devices were the same as in the adapter for inspection of circuit devices according to Example 5. A proportion of the conductive particles in the conductive path-forming parts was 30% in terms of volume fraction.

Evaluation of Adapter for Inspection of Circuit Devices

The adapters for inspection of circuit devices according to Example 5, Comparative Examples 3 to 5, and Referential Example 3 were separately used to fabricate inspection apparatus of the construction shown in FIG. 14.

On the other hand, a circuit board to be inspected, which had 512 electrodes to be inspected on each surface thereof, and on which a solder resist having a thickness of 38 μm had been formed, was provided. The dimensions of the electrodes to be inspected were such that the diameter was 200 μm, the thickness was 30 μm, and the pitch was 500 μm.

This circuit board to be inspected was then kept in the inspection-executing region of the inspection apparatus and was held pressurized by the upper-side adapter and the lower-side adapter in such a manner that a load applied to one electrode to be inspected was 25 gf. In this state, a current of 20 mA was supplied to measure electrical resistance between the electrodes for inspection in the upper-side adapter and their corresponding electrodes for inspection in the lower-side adapter by a tester. Thereafter, the load applied to each electrode to be inspected was changed to 0 gf. This process was determined to be a cycle and repeated to count the number of cycles by the electrical resistance value as to any electrode for inspection exceeds 300 kΩ. The results are shown in Table 2.

TABLE 2

| | Durometer Hardness of Elastic Polymeric Substance | Coated amount of Lubricant or Parting Agent by mass per 100 parts by mass of Conductive Particles | Initial Electrical Resistance (Ω) | Number of cycles by the Electrical Resistance Value Exceeds 300 kΩ |
|---|---|---|---|---|
| Example 5 | 40 | 2.5 | 3.3 | 70000 |
| Comparative Example 3 | 40 | 0 | 3.3 | 5000 |
| Comparative Example 4 | 40 | 0 | 3.3 | 15000 |
| Comparative Example 5 | 18 | 2.5 | 3.6 | 10000 |
| Referential Example 3 | 40 | 20 | 3.8 | 10000 |

As apparent from the results shown in Table 2, it was confirmed that according to the adapter for inspection of circuit devices of Example 5, an increase in electrical resistance upon repeated used is small, and so a long service life can be achieved in this adapter owing to its high durability upon repeated use.

Effect of the Invention

As described above, according to the anisotropically conductive sheet of the present invention, the required conductivity can be retained over a long period of time even when it is used repeatedly over many times, or even when it is used under a high-temperature environment, and so a long service life can be achieved owing to its high durability upon repeated use and thermal durability.

According to the production process of the present invention, there can be produced anisotropically conductive sheets having a long service life owing to their high durability upon repeated use and thermal durability.

According to the adapter for inspection of circuit devices of the present invention, the frequency of exchanging the adapter in the inspection of circuit devices becomes a little because the anisotropically conductive sheet having a long service life owing to its high durability upon repeated use and thermal durability is used. As a result, the inspection of the circuit devices can be executed with high efficiency. In addition, a good, electrically connected state can be stably retained even at varied temperatures because the anisotropically conductive sheet is integrally provided on the circuit board for inspection.

According to the inspection apparatus for circuit devices of the present invention, the frequency of exchanging the anisotropically conductive sheet becomes a little because the anisotropically conductive sheet has a long service life owing to its high durability upon repeated use and thermal durability is used. As a result, the inspection of the circuit devices can be executed with high efficiency.

According to the electronic part-packaged structure of the present invention, a good, electrically connected state can be stably retained over a long period of time.

What is claimed is:

1. An anisotropically conductive sheet, comprising:

conductive particles contained in an elastic polymeric substance, the particles exhibiting magnetism in a state oriented in a thickness-wise direction of the sheet, and a lubricant or parting agent which is coated on the surfaces of the conductive particles, wherein said lubricant or parting agent is interposed between the conductive particles and the elastic polymeric substance, wherein a durometer hardness of the elastic polymeric substance is 20 to 90.

2. The anisotropically conductive sheet according to claim 1, wherein an amount of the lubricant or parting agent coated on the surfaces of the conductive particles is 10/Dn to 150/Dn parts by mass per 100 parts by mass of the conductive particles, wherein Dn means the number average diameter (μm) of the conductive particles.

3. The anisotropically conductive sheet according to claim 1 or 2, wherein the lubricant or parting agent coated on the surfaces of the conductive particles comprises silicone oil.

4. The anisotropically conductive sheet according to claim 3, wherein the silicone oil contains fluorine atom(s) in its molecule.

5. The anisotropically conductive sheet according to claim 4, which comprises a plurality of conductive path-forming parts each closely containing the conductive particles and extending in the thickness-wise direction of the sheet, and insulating part(s) for insulating these conductive path-forming parts mutually.

6. An adapter for inspection of circuit devices, comprising:

a circuit board for inspection on the surface of which a plurality of electrodes for inspection has been formed in accordance with a pattern corresponding to electrodes to be inspected of a circuit device to be inspected, and the anisotropically conductive sheet according to claim 5 integrally provided on a surface of the circuit board for inspection.

7. The adapter for inspection of circuit devices according to claim 6, wherein at least a part of each of the electrodes for inspection in the circuit board for inspection is formed of a magnetic material.

8. An inspection apparatus for circuit devices, comprising:

a circuit board for inspection on the surface of which a plurality of electrodes for inspection are formed in accordance with a pattern corresponding to electrodes to be inspected of a circuit device to be inspected, and the anisotropically conductive sheet according to claim 5 interposed between the circuit board for inspection and the circuit device.

9. An electronic part-packaged structure, comprising:

a circuit board and an electronic part electrically connected to the circuit board through the anisotropically conductive sheet according to claim 5.

10. An adapter for inspection of circuit devices, comprising:

a circuit board for inspection on the surface of which a plurality of electrodes for inspection has been formed in accordance with a pattern corresponding to electrodes to be inspected of a circuit device to be inspected, and the anisotropically conductive sheet according to claim 4 integrally provided on a surface of the circuit board for inspection.

11. The adapter for inspection of circuit devices according to claim 10, wherein at least a part of each of the electrodes for inspection in the circuit board for inspection is formed of a magnetic material.

12. An inspection apparatus for circuit devices, comprising:

a circuit board for inspection on the surface of which a plurality of electrodes for inspection are formed in accordance with a pattern corresponding to electrodes to be inspected of a circuit device to be inspected, and the anisotropically conductive sheet according to claim 4 interposed between the circuit board for inspection and the circuit device.

13. An electronic part-packaged structure, comprising:

a circuit board and an electronic part electrically connected to the circuit board through the anisotropically conductive sheet according to claim 4.

14. The anisotropically conductive sheet according to claim 1 or 2, wherein the lubricant or parting agent applied to the surfaces of the conductive particles is a fluorine-containing lubricant or parting agent.

15. An electronic part-packaged structure, comprising:

a circuit board and an electronic part electrically connected to the circuit board through the anisotropically conductive sheet according to claim 14.

16. The anisotropically conductive sheet according to claim 1 or 2, which comprises a plurality of conductive path-forming parts each closely containing the conductive particles and extending in the thickness-wise direction of the sheet, and insulating part(s) for insulating these conductive path-forming parts mutually.

17. An adapter for inspection of circuit devices, comprising:

a circuit board for inspection on the surface of which a plurality of electrodes for inspection has been formed in accordance with a pattern corresponding to electrodes to be inspected of a circuit device to be inspected, and the anisotropically conductive sheet according to claim 16 integrally provided on a surface of the circuit board for inspection.

18. The adapter for inspection of circuit devices according to claim 17, wherein at least a part of each of the electrodes for inspection in the circuit board for inspection is formed of a magnetic material.

19. An inspection apparatus for circuit devices, comprising:

a circuit board for inspection on the surface of which a plurality of electrodes for inspection are formed in accordance with a pattern corresponding to electrodes to be inspected of a circuit device to be inspected, and the anisotropically conductive sheet according to claim 16 interposed between the circuit board for inspection and the circuit device.

20. An electronic part-packaged structure, comprising:

a circuit board and an electronic part electrically connected to the circuit board through the anisotropically conductive sheet according to claim 16.

21. An adapter for inspection of circuit devices, composing:

a circuit board for inspection on the surface of which a plurality of electrodes for inspection has been formed in accordance with a pattern corresponding to electrodes to be inspected of a circuit device to be inspected, and the anisotropically conductive sheet according to any one of claims 1 and 2 integrally provided on a surface of the circuit board for inspection.

22. The adapter for inspection of circuit devices according to claim 21, wherein at least a part of each of the electrodes for inspection in the circuit board for inspection is formed of a magnetic material.

23. An inspection apparatus for circuit devices, comprising:

a circuit board for inspection on the surface of which a plurality of electrodes for inspection are formed in accordance with a pattern corresponding to electrodes to be inspected of a circuit device to be inspected, and the anisotropically conductive sheet according to any one of claims 1 and 2 interposed between the circuit board for inspection and the circuit device.

24. An electronic part-packaged structure, comprising:

a circuit board and an electronic part electrically connected to the circuit board through the anisotropically conductive sheet according to any one of claims 1 and 2.

25. The anisotropically conductive sheet according to claim 1, wherein the conductive particles and the elastic polymeric substance are prevented from integrally adhering to each other.

26. The anisotropically conductive sheet according to claim 1, wherein conductive paths are formed when the sheet is pressurized in the thickness-wise direction.

27. A process for producing an anisotropically conductive sheet, comprising:

coating the surfaces of conductive particles exhibiting magnetism with a lubricant or parting agent, to obtain coated particles, dispersing the coated particles in a liquid material capable of forming an elastic polymeric substance, and forming a sheet-forming material layer, applying a magnetic field to the sheet-forming material layer in the thickness-wise direction thereof, and subjecting the sheet-forming material layer to the a curing treatment, thereby converting said liquid material into the elastic polymeric substance.

* * * * *